United States Patent
O'Loughlin

(10) Patent No.: US 11,769,981 B1
(45) Date of Patent: Sep. 26, 2023

(54) CIRCUIT AND METHOD FOR REGULATING CURRENTS TO MULTIPLE LOADS

(71) Applicant: The Government of the United States as represented by the Secretary of the Air Force, Kirtland AFB, NM (US)

(72) Inventor: James Peter O'Loughlin, Placitas, NM (US)

(73) Assignee: Government of the United States as represented by the Secretary of the Air Force, Kirtland AFB, NM (US)

( * ) Notice: Subject to any disclaimer, the term of this patent is extended or adjusted under 35 U.S.C. 154(b) by 638 days.

(21) Appl. No.: 16/833,471

(22) Filed: Mar. 27, 2020

(51) Int. Cl.
| | |
|---|---|
| H01S 3/091 | (2006.01) |
| H01J 25/50 | (2006.01) |
| H01S 3/0941 | (2006.01) |
| H01S 5/042 | (2006.01) |

(52) U.S. Cl.
CPC ............ *H01S 3/0912* (2013.01); *H01J 25/50* (2013.01); *H01S 3/0941* (2013.01); *H01S 5/042* (2013.01)

(58) Field of Classification Search
CPC ...... H01S 3/0912; H01S 3/0941; H01S 5/042; H01J 25/50
See application file for complete search history.

(56) References Cited

U.S. PATENT DOCUMENTS

| | | | |
|---|---|---|---|
| 2,605,457 A | 7/1952 | Peterson | |
| 2,776,382 A | 1/1957 | Jensen | |
| 3,320,439 A | 5/1967 | Widlar | |
| 3,350,628 A | 10/1967 | Gallaher et al. | |
| 3,582,824 A * | 6/1971 | Lencioni, Jr. | H03L 5/00 331/109 |
| 4,004,187 A * | 1/1977 | Walker | H05B 41/392 315/DIG. 5 |
| 6,388,430 B1 * | 5/2002 | Eldridge | G05F 1/14 323/305 |
| 6,711,380 B1 * | 3/2004 | Callaway, Jr. | H04W 16/14 455/66.1 |
| 2004/0028101 A1 * | 2/2004 | Byren | H01S 3/113 372/39 |
| 2009/0122820 A1 * | 5/2009 | Trestman | H01S 5/042 372/38.02 |
| 2010/0176755 A1 * | 7/2010 | Hoadley | H02P 27/06 363/5 |
| 2017/0279246 A1 * | 9/2017 | Muendel | B23K 26/0876 |

OTHER PUBLICATIONS

Elliot, Rod, "Voltage & Current Regulators and How to Use Them", http://www.sound.westhost.com/articles/vi-regulators.html, Jun. 2013.

* cited by examiner

*Primary Examiner* — Xinning(Tom) Niu
(74) *Attorney, Agent, or Firm* — David L. Narciso; AFNWC/JA

(57) ABSTRACT

The embodiments disclosed herein reduce numerous active regulators (e.g., to only one) used in previous circuits that require regulated current and still accomplish the current regulation provided to each load by means of an array of autotransformers, and if required, rectifiers, and filters. Therefore, in an exemplary embodiment, there is eliminated the numerous active regulators by replacing them with simple passive components and an active regulator.

5 Claims, 8 Drawing Sheets

US 11,769,981 B1

CIRCUIT AND METHOD FOR REGULATING CURRENTS TO MULTIPLE LOADS

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

FIELD OF THE DISCLOSURE

The purpose of the disclosure is an improved constant current circuit.

BACKGROUND

FIG. 1 is a simplified diagram of the prior art for providing regulated current to "n" loads by means of an active feedback regulator for each load. FIG. 1 is the simplest case in which the "n" loads R1 through Rn 102 are approximately equal but drift somewhat with time due to temperature and various other causes and also require regulation due to the variations in the prime power direct current (DC) bus 103. Current is regulated by the 1 through "n" active current feedback regulators 104 working from the power source 103.

SUMMARY

Aspects of the embodiments disclosed herein include a constant current circuit for driving a plurality of loads comprising: a current regulator and an autotransformer coupled to the current regulator, wherein said autotransformer is divided so that each half has substantially equal inductances to ensure that the load currents in the plurality of loads are substantially equal.

One aspect of the embodiments disclosed herein includes a constant current circuit for driving a plurality of loads comprising: a current regulator; a first autotransformer coupled to the current regulator, wherein said first autotransformer is divided so that each half has substantially equal inductances; a second autotransformer receiving a first current from the first autotransformer; and a first load connected in series with the first autotransformer from which the first load receives a second current, wherein the first and second currents are substantially equal.

An additional aspect of the embodiments disclosed herein includes a constant current circuit for driving a plurality of loads comprising: a current regulator; a first autotransformer coupled to the current regulator, wherein said first autotransformer is divided so that each half has substantially equal inductances; a second transformer receiving a first current from the first autotransformer; and a third transformer receiving a second current from the first autotransformer, wherein the first and second currents are substantially equal.

Another aspect of the embodiments disclosed herein includes a constant current circuit for driving a plurality of loads comprising a current regulator and a first transformer coupled to the current regulator, wherein said first transformer is coupled in series with a second transformer and a third transformer, wherein the turn ratios of the second and third transformers are the same.

Other aspects and advantages of the embodiments will become apparent from the following detailed description, taken in conjunction with the accompanying drawings, and illustrating by way of example the principles of the embodiments.

DETAILED DESCRIPTION

Some circuit components require excitation by regulated constant currents. One example is pump diode strings in high power solid state and fiber lasers. Previously, to accomplish this, a separate current regulator has been used for each string. Each of these regulators is a complex active device which must be duplicated for each load. The embodiments disclosed herein reduce the number of active regulators (e.g., to only one) and still accomplish the current regulation provided to each of numerous load strings by means of an array of transformers and, if required, rectifiers and filters for direct current loads. Therefore at least one embodiment disclosed herein eliminates the numerous active regulators by replacing them with simple passive components and a single active regulator. The power rating of the single active regulator is equal to the sum of the numerous regulators per load and therefore the embodiments disclosed herein are more economic, reliable and efficient by virtue of the economy of size principle.

For purposes of this disclosure and the claims, the words "about" or "substantially" when accompanying a numerical value are to be construed as indicating a deviation of typically up to and inclusive of +/−1% from the stated numerical value.

Figure 1:
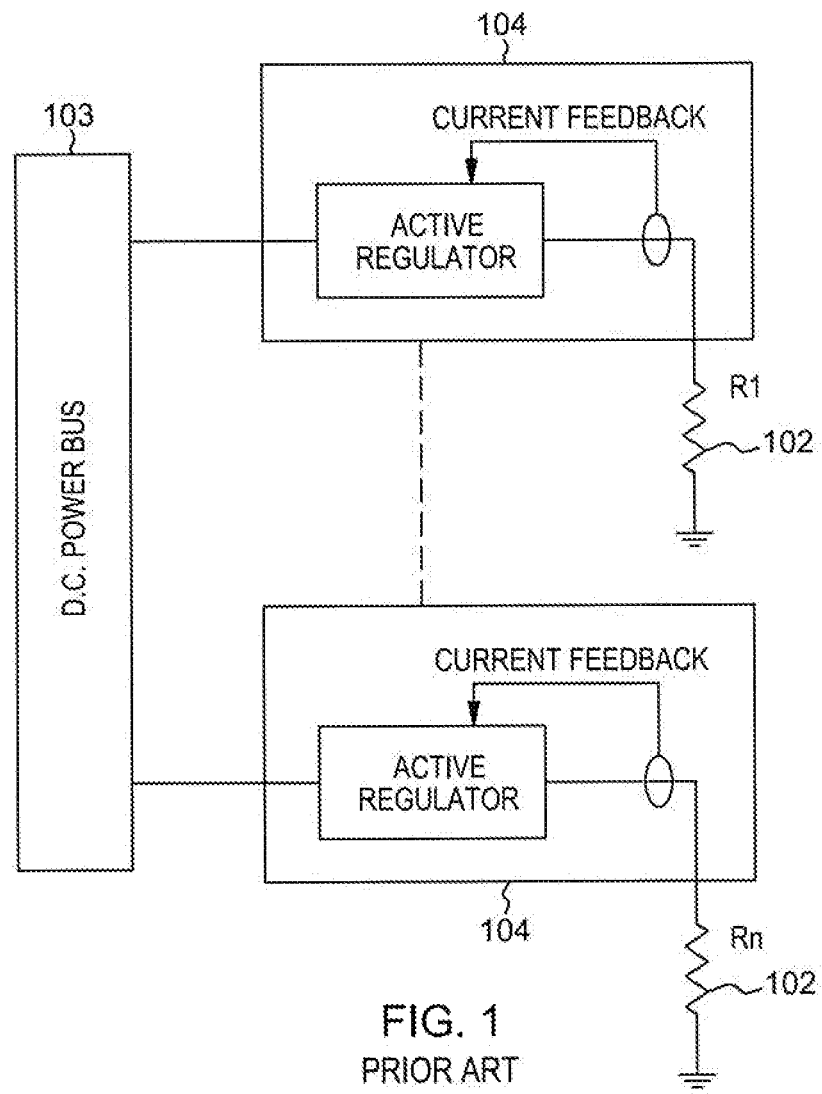
FIG. 1 is a simplified diagram of the prior art for providing regulated current to n loads by means of an active feedback regulator for each load.
Figure 2:
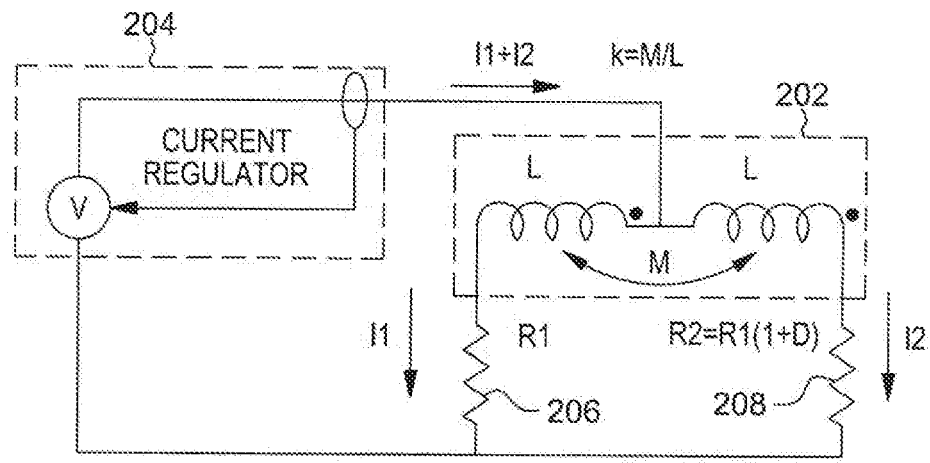
FIG. 2 discloses a center-tapped auto transformer circuit to implement current balancing.

FIG. 2 discloses a center-tapped autotransformer circuit to implement current balancing. The circuit may be used as a pump laser diode driver. A center-tapped autotransformer 202 is connected from an alternating current (AC) source 204 to two loads, 206 and 208, which will tend to force the currents (I1 and I2) in the two loads 206 and 208 to be equal. Although two loads 206 and 208 are shown, in alternative embodiments the number of loads can be greater. The effectiveness of the current balancing depends upon the circuit parameters and is shown by circuit analysis. The circuit in FIG. 2 includes a current regulation feature such as source 204. In source 204, voltage V is controlled to to maintain the sum of currents I1+I2 at a constant value. Load currents that have different nominal values can also be accommodated by the proper selection of the ratio of the autotransformer. The current ratio, I1/I2, shown in Equation 1 below is substantially one to one as established by the center-tapped autotransformer 202 having the two halves with substantially equal inductances (L). M as shown in FIG. 2 represents the mutual inductance between the halves of the autotransformer 202. The Kirchhoff loop equations for the ratio of I1 to I2 can be expressed as:

$$I\text{ratio}\left(\frac{I1}{I2}\right) = I\text{ratio}(Q, D, k) = \frac{1 + D + j \cdot Q \cdot (1 + k)}{1 + j \cdot Q \cdot (1 + k)} \quad \text{Equation 1}$$

Figure 3:
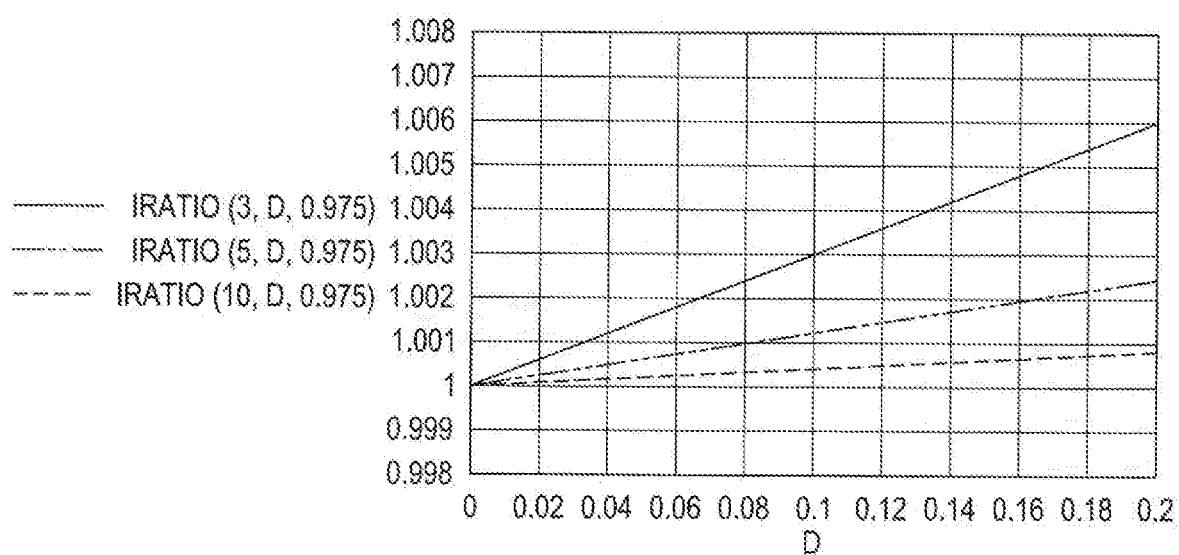
FIG. 3 illustrates the dependence of the magnitude of the current ratio on the value of the parameter $D=R_2/R_1-1$, and the parameter $Q=3$, where $Q=(\omega L)/R$ vs. the coupling, k, according to formula in Equation 1 disclosed herein.

The current ratio is independent from the root-mean-squared (rms) source 204 voltage, V; however, the sum (I1+I2) is regulated to a constant value. The parameter D defines the unbalance between the loads. The parameter k is the coupling coefficient between the substantially equal halves of the center-tapped autotransformer 202 with each half having a self-inductance of L. In this case, therefore, k will be equal to M/L. The radian frequency of the source 204 is $\omega=2\pi f$, where f is the frequency in Hertz. The Q value= (inductive reactance ($\omega L$))/(series resistance). By inspection of Equation 1 it is clear that if D<≈0.5 (50%), as a reasonable limit of the mismatch, and j$\omega$L is >>R, then the current ratio substantially approaches 1. FIG. 3 illustrates the dependence of the magnitude of the current ratio on the value of the parameter $D=R_2/R_1-1$, and the parameter Q=3, where $Q=(\omega L)/R$ vs. the coupling, k, according to formula in Equation 1. The objective is to obtain the magnitude of the current ratio≈1.0. Although a D mismatch of ~0.5 (50%) can be accommodated, in practice when the loads are diode strings, and if a mismatch occurs due to some of the diodes in one string failing to short circuit, then a more reasonable and tolerable mismatch would be on the order of 10%, which the embodiments herein will accommodate quite well as shown in FIG. 3.

Figure 4:
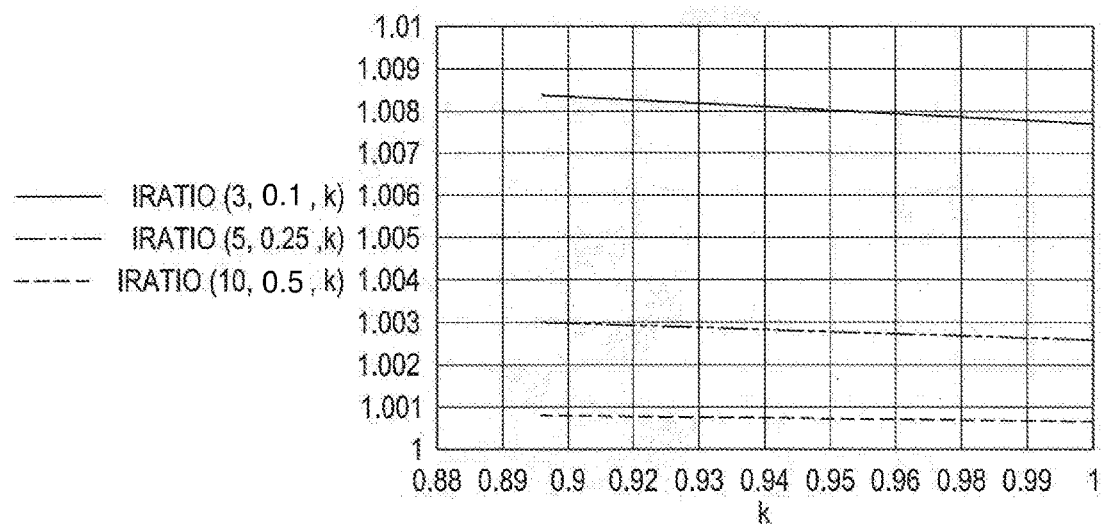
FIG. 4 is a chart showing the effect of k on the magnitude of the current ratio for the parameters $Q=3$ and $D=0.1$, 0.25 and 0.50.

The dependence of the current ratio on the value of the coupling coefficient, k, is illustrated in FIG. 4. The plot shows the current ratio for k=0.900 to 0.999 where D=0.1, D=0.25 and D=0.5 with L=1 millihenry (mH), f=10,000 and R=10. FIG. 4 shows that for D=0.25 (a bad mismatch of 25%) the current is maintained within less than 1.0% current ratio mismatch. This verifies the effectiveness of the embodiments disclosed herein for improving the current ratio change with respect to the change of the load, R7.

Another concern is the voltage drop introduced by the autotransformer 202. For practical purposes this is insignificant because the high mutual coupling between the winding sections effectively cancels the forward drop of the self-inductance. This is substantiated by the expression for the ratio of the impressed voltage, V, to the voltage across the load, R, as shown by:

$$V\text{ratio}(k, D, Q) = \frac{1 + D + i \cdot Q \cdot (1 + k)}{Q^2 \cdot (k^2 - 1) + i \cdot Q \cdot (D + 2) + 1 + D} \quad \text{Equation 2}$$

Figure 5:
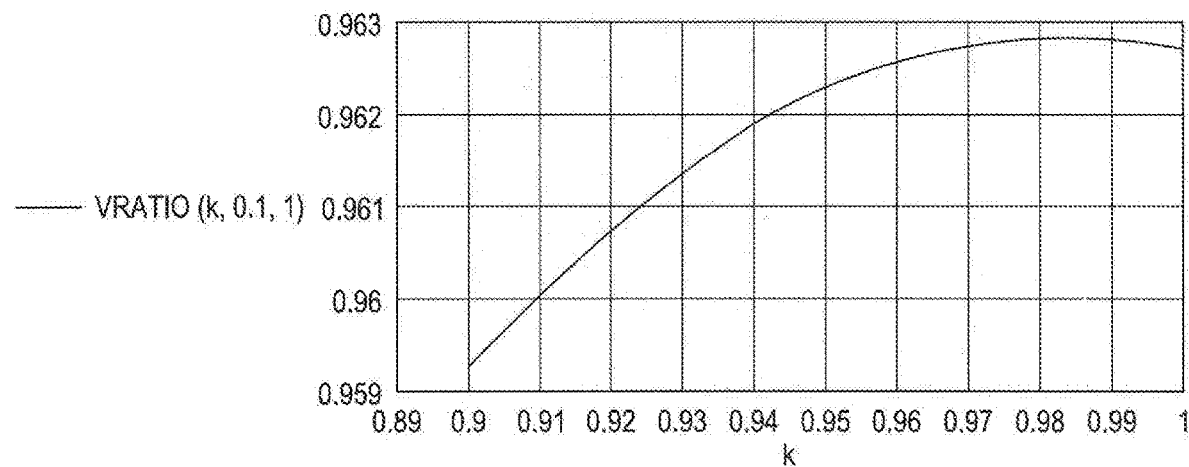
FIG. 5 is a chart showing the magnitude of the voltage transfer ratio versus coupling k for the values of the parameters $D=0.1$ and $Q=1.0$, according to the formula in Equation 2 disclosed herein.

In Equation 2, the Q value=($\omega L$)/R. FIG. 5 is a chart showing the magnitude of the voltage transfer ratio versus coupling k for the values of the parameters D=0.1 and Q=1.0, according to the formula in Equation 2. The results clearly show that the voltage transfer ratio of Equation 2 is over 95%. Although increasing the coupling, k, improves the transfer ratio, even easily achieved values of k as low as 0.90 provide very acceptable transfer ratios.

Figure 6:
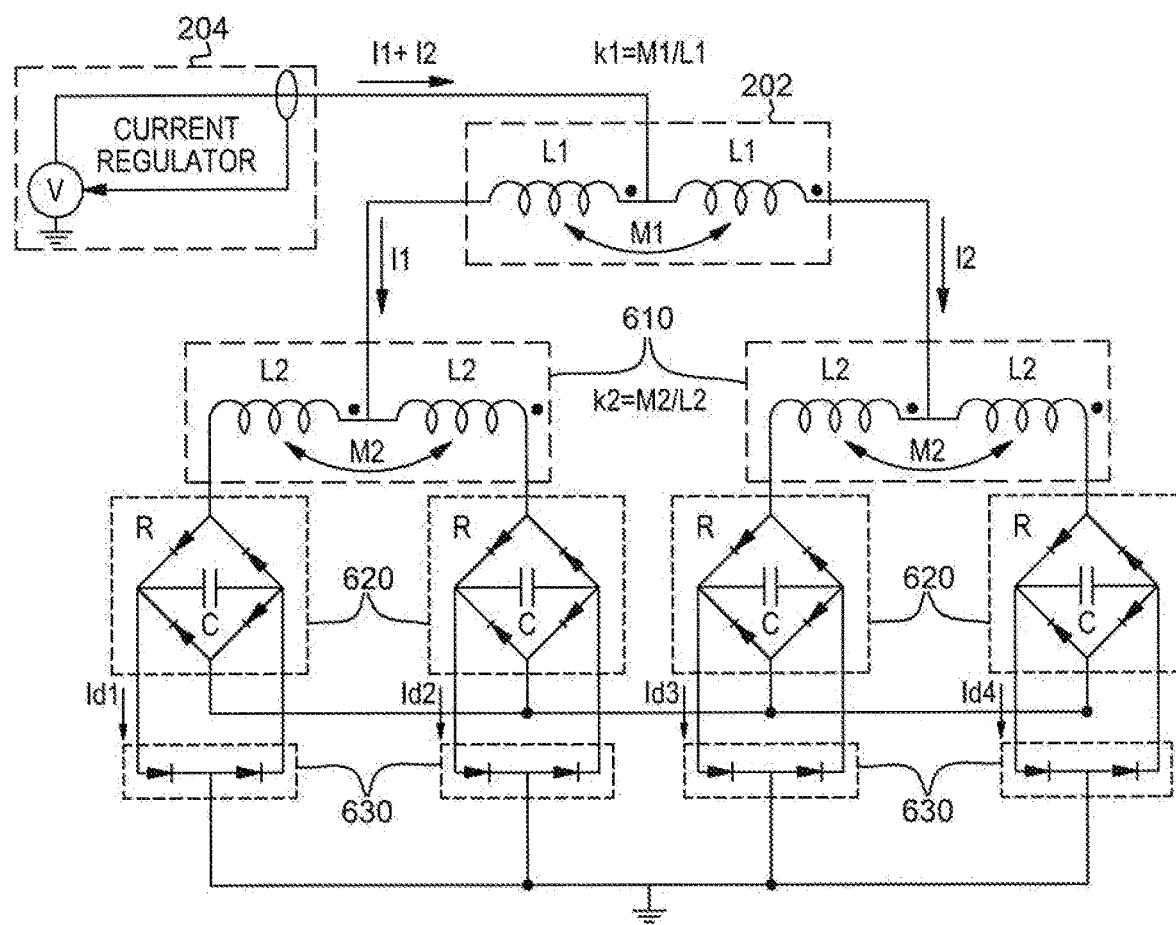
FIG. 6 is a diagram of the center-tapped auto transformer expanded to accommodate four DC diode string loads.

The embodiment as shown in FIG. 2 can also be expanded to include several stages in alternative embodiments. An example of an expansion that includes additional autotransformers 610 and four loads 630 is shown in FIG. 6. FIG. 6 includes rectifiers (R) and filter capacitors (C) in rectifier blocks 620 to provide regulated DC currents (Id1, Id2, Id3 and Id4) to each of the diode string loads 630 that typically represent pump diodes for a solid state laser. The value of the filter capacitor, C, in the rectifier blocks 620 is selected to provide the required ripple reduction for the particular application. The configuration in FIG. 6 may be expanded to include more loads either resistive or rectified.

The descriptive operation of the circuit in FIG. 6 is as follows: the regulated current (I1+I2) passes through the autotransformer 202 which operates to hold the values of I1 and I2 to be equal. These two equal currents are then passed through the two autotransformers 610 which in turn each divide the currents into four equal output currents. These four equal output currents are then passed through the rectifiers R in rectifier blocks 620. The rectified equal currents are filtered by the capacitors, C, and then passed to the four loads of diode strings 630. Since the total primary input current (I1+I2) is regulated and I1 being equal to I2, the final equal currents passed to the loads 630 from the autotransformers 610 through the rectifier blocks 620 are also equal and regulated.

At least one advantage of some of the embodiments disclosed herein is that they use only one current regulator to accommodate numerous loads. Although the power rating of the regulator in the disclosed embodiments is the same as the total power ratings of the sum of the regulators in the previous art, which requires a separate regulator for each load, the use of a single regulator reduces the complexity, and increases the reliability due to a lower component count, and reduces the total weight and volume due to the economy of size.

Figure 7:
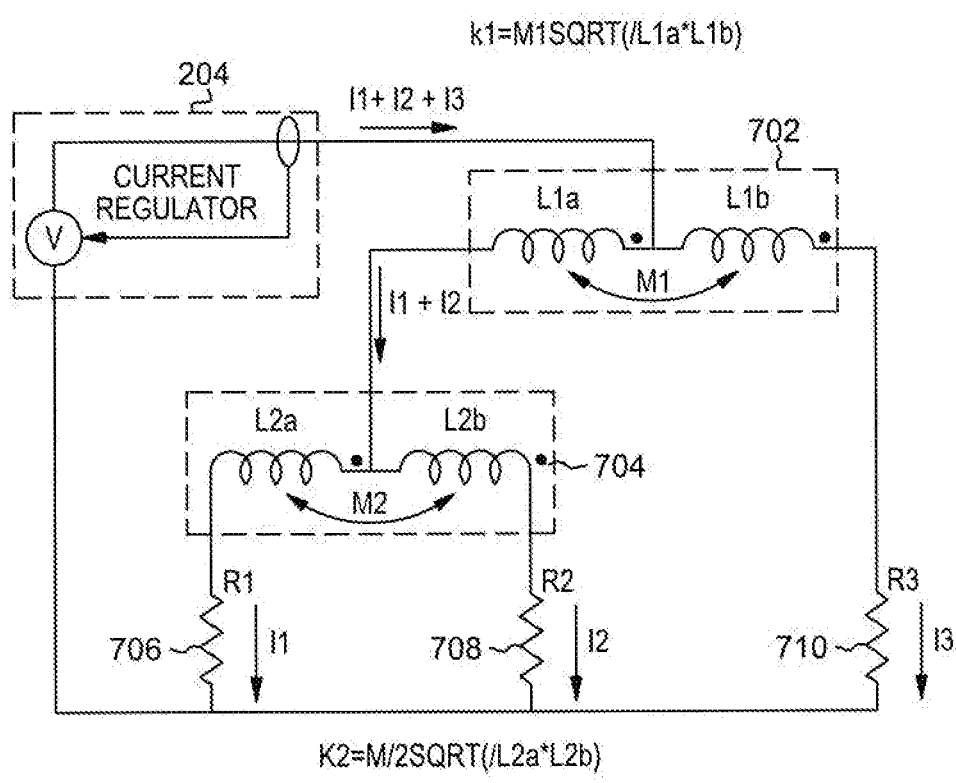
FIG. 7 is a diagram of the center-tapped auto transformer expanded to accommodate unequal currents.

The embodiments can also be adapted to provide different regulated current magnitudes to the loads by designing the autotransformer configuration and ratios. The following example illustrates the case for three loads having regulated current magnitudes of I1, I2 and I3 is illustrated in FIG. 7. The currents carried by the autotransformer 702 impose the ratio of the inductances of the transformer according to the ratio of the square of the currents. Specifically, for the autotransformer 702 the inductance ratio, $L1a/L1b=((I1+I2)/I3)^2$. For autotransformer 704, $L2a/L2b=(I1/I2)^2$. If the load voltages are the same, the autotransformers will have minimum winding voltages and thus minimum power ratings. If the loads, 706, 708, and 710, have different voltages, then the autotransformer windings are designed to accommodate that condition and will have higher power ratings.

Figure 8:
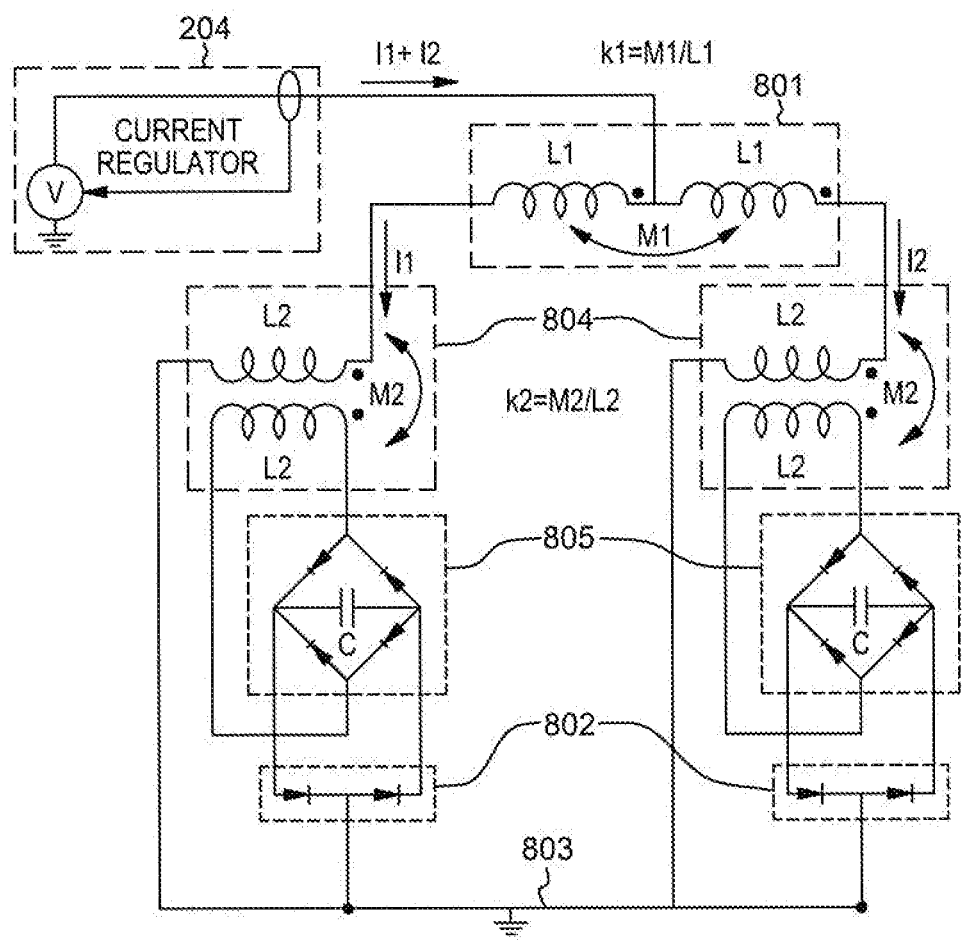
FIG. 8 is a diagram of an alternative configuration for providing common ground center-tapped loads.

Another alternative configuration is illustrated in FIG. 8, which provides for driving diode loads 802 having a common center-tap ground 803. At the output of the current regulator 204 is autotransformer 801. Autotransformer 801 is connected to transformers 804. The loads in the circuit shown in FIG. 8 consist of center-tapped diode strings 802 which may be used as pump diodes in solid state lasers, and the circuit shown therein can be extended to accommodate additional loads. Transformers 804 can be any number, i.e., more than the two shown in FIG. 8 and, accordingly, autotransformer 801 can be divided into any number of equal parts to connect to a like number of transformers 804. To accommodate the common ground's isolation, transformers 804 are used to eliminate the cross conduction interference between the rectifier blocks 805.

Figure 9:
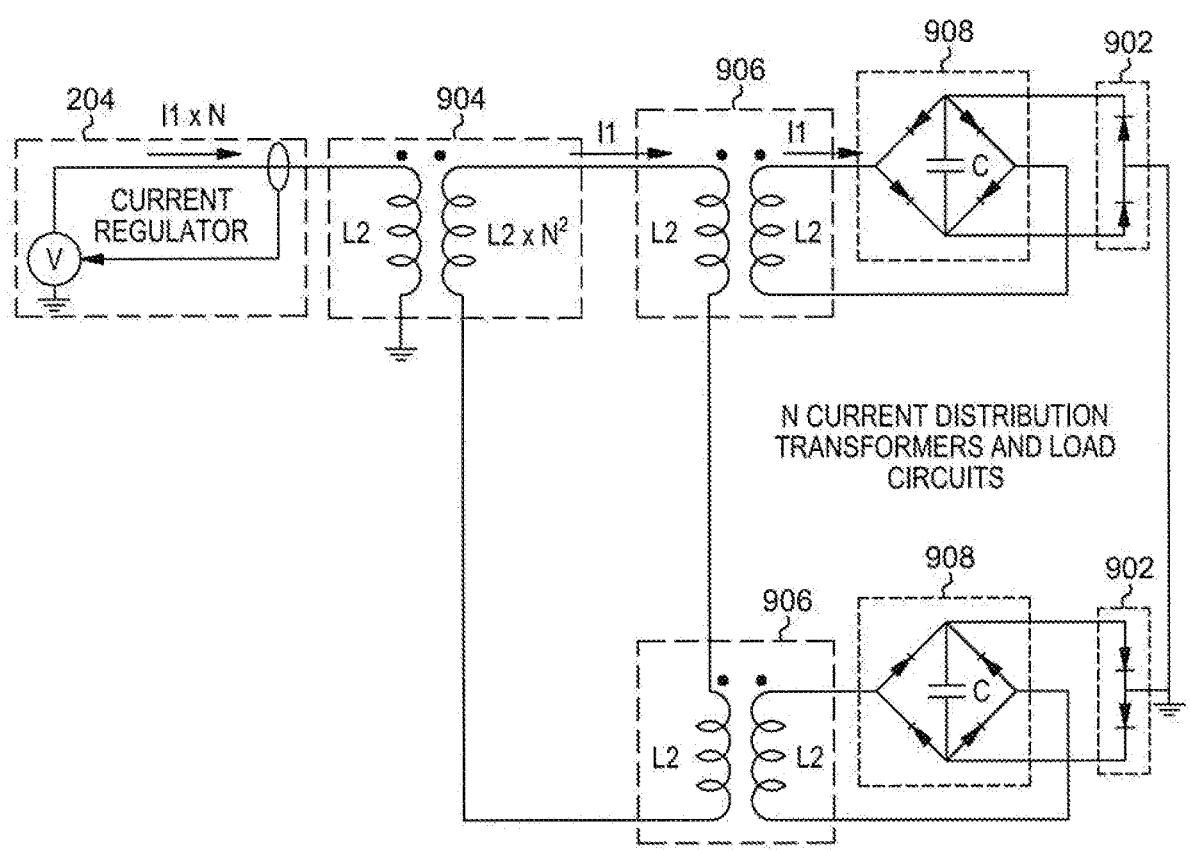
FIG. 9 is a diagram of an alternative configuration for N center tapped loads with low current distribution line.

Another alternative circuit is shown in FIG. 9 consisting of N center-tapped diode strings 902 which may also be used as pump diodes in solid state lasers and including a step-up transformer, 904, at the output of the current regulator 204. A plurality of N transformers 906 accomplish the load distribution. The load distribution transformers 906 (i.e., one for each center-tapped load 902) have equal turn ratios with the primaries connected in series. Thus the regulated primary current is equal in the primary and secondary of each of the load distribution transformers 906 which determines that the same regulated current is delivered to rectifier blocks 908 and each of the diode string loads 902. A purpose of this configuration is to minimize the current in the line connecting the step-up transformer 904 at the regulated source 204 and the load distribution transformers 906, thus reducing the size and weight of the connection line. The lower current is a result of the voltage being stepped up by a factor, N, and consequently the current being stepped down by a factor, N, by the step-up transformer 904 at the regulated source 204. This configuration is advantageous when there is a considerable distance between the regulated source and numerous loads.

The advantages of some or all the embodiments disclosed herein include reducing the size, weight and cost when applied to the pump diode drivers of high power lasers. Other applications for the disclosed embodiments include those that require regulated power to multiple loads such as high power continuous wave (CW) radar and microwave weapons, especially when the parallel microwave power zo tubes are magnetrons that require equal current drive.

Figure 10:
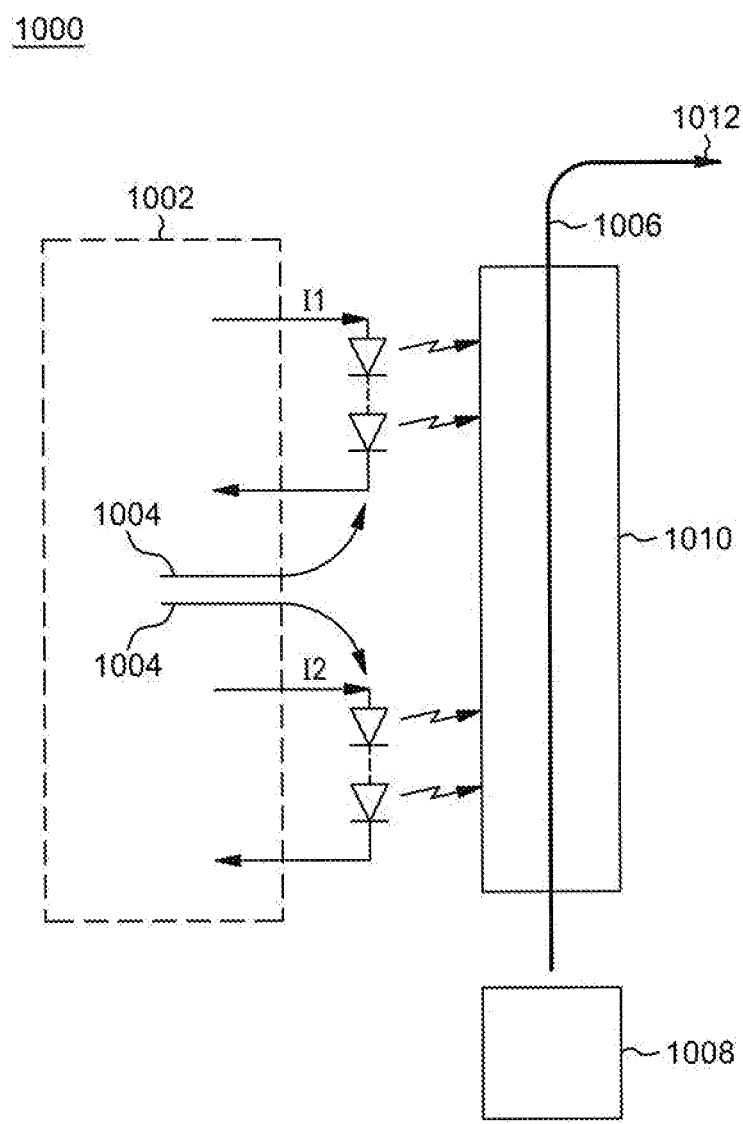
FIG. 10 is a cross-sectional view of a fiber laser incorporating the embodiments disclosed herein.

FIG. 10 illustrates a system 1000 which uses embodiments of the pump laser diode driver 1002 disclosed herein to produce substantially equal currents (I1 and I2) to drive two pump diode strings 1004 for a fiber laser power amplifier 1006 coupled to a seed laser 1008 and pump diode optical combiner 1010 to output an amplified laser 1012.

The foregoing described embodiments have been presented for purposes of illustration and description and are not intended to be exhaustive or limiting in any sense. Alterations and modifications may be made to the embodiments disclosed herein without departing from the spirit and scope of the invention. No language in the specification should be construed as indicating any non-claimed element as essential to the practice of the invention. The actual scope of the invention is to be defined by the claims.

The definitions of the words or elements of the claims shall include not only the combination of elements which are literally set forth, but all equivalent structure, material or acts for performing substantially the same function in substantially the same way to obtain substantially the same result.

The words used in this specification to describe the invention and its various embodiments are to be understood not only in the sense of their commonly defined meanings, but to include by special definition in this specification any structure, material or acts beyond the scope of the commonly defined meanings. Thus if an element can be understood in the context of this specification as including more than one meaning, then its use in a claim must be understood as being generic to all possible meanings supported by the specification and by the word itself.

The terms "a", "an" and "the" mean "one or more" unless expressly specified otherwise. The terms "including", "comprising" and variations thereof mean "including but not limited to" unless expressly specified otherwise. The term "plurality" means "two or more" unless expressly specified otherwise. The phrase "at least one of", when such phrase modifies a plurality of things (such as an enumerated list of things) means any combination of one or more of those things, unless expressly specified otherwise. The use of any and all examples, or exemplary language ("e.g." or "such as") provided herein, is intended merely to better illuminate the invention and does not pose a limitation on the scope of the invention unless otherwise claimed.

Recitation of ranges of values herein are merely intended to serve as a shorthand method of referring individually to each separate value falling within the range, unless otherwise indicated herein, and each separate value is incorporated into the specification as if it were individually recited herein. Therefore, any given numerical range shall include whole and fractions of numbers within the range. For example, the range "1 to 10" shall be interpreted to specifically include whole numbers between 1 and 10 (e.g., 1, 2, 3, . . 9) and non-whole numbers (e.g., 1.1, 1.2, . . . 1.9).

Where a limitation of a first claim would cover one of a feature as well as more than one of a feature (e.g., a limitation such as "at least one widget" covers one widget as well as more than one widget), and where in a second claim that depends on the first claim, the second claim uses a definite article "the" to refer to the limitation (e.g., "the widget"), this does not imply that the first claim covers only one of the feature, and this does not imply that the second claim covers only one of the feature (e.g., "the widget" can cover both one widget and more than one widget).

Neither the Title (set forth at the beginning of the first page of the present application) nor the Abstract (set forth at the end of the present application) is to be taken as limiting in any way as the scope of the disclosed invention(s). The title of the present application and headings of sections provided in the present application are for convenience only, and are not to be taken as limiting the disclosure in any way.

Devices that are described as in "communication" with each other or "coupled" to each other need not be in continuous communication with each other or in direct physical contact, unless expressly specified otherwise. On the contrary, such devices need only transmit to each other as necessary or desirable, and may actually refrain from exchanging data most of the time. For example, a machine in communication with or coupled with another machine via the Internet may not transmit data to the other machine for long period of time (e.g. weeks at a time). In addition, devices that are in communication with or coupled with each other may communicate directly or indirectly through one or more intermediaries.

Although process (or method) steps may be described or claimed in a particular sequential order, such processes may be configured to work in different orders. In other words, any sequence or order of steps that may be explicitly described or claimed does not necessarily indicate a requirement that the steps be performed in that order unless specifically indicated. Further, some steps may be performed simultaneously despite being described or implied as occurring non-simultaneously (e.g., because one step is described after the other step) unless specifically indicated. Where a process is described in an embodiment the process may operate without any user intervention.

The invention claimed is:

1. A constant current circuit for driving a plurality of loads comprising:
    a current regulator;

a first autotransformer coupled to the current regulator;

the first autotransformer being divided into parts, wherein each of the parts has an inductance and the inductances are substantially equal, and a second autotransformer for receiving a first current from the first autotransformer and a third autotransformer for receiving a second current from the first autotransformer, wherein the first and second currents are substantially equal.

2. The circuit of claim 1, further comprising:

a first rectifier block for receiving a third current from the second autotransformer and a second rectifier block for receiving a fourth current from the second autotransformer, wherein the third and fourth currents are substantially equal; and a third rectifier block receiving a fifth current from the third autotransformer and a fourth rectifier block receiving a sixth current from the third autotransformer, wherein the fifth and sixth currents are substantially equal.

3. The circuit of claim 2, further comprising:

a first load electrically connected to the first rectifier block;

a second load electrically connected to the second rectifier block;

a third load electrically connected to the third rectifier block; and a fourth load electrically connected to the fourth rectifier block.

4. The circuit of claim 2, wherein the first, second, third and fourth loads are each pump diodes in a solid state laser.

5. A constant current circuit for driving a plurality of loads comprising:

a current regulator;

a first autotransformer electrically coupled to the current regulator;

said first autotransformer being divided into parts, wherein each of the parts has an inductance substantially equal to the respective inductances of the other parts;

a second autotransformer for receiving a first current from the first autotransformer;

a first load connected in series with the first autotransformer, with the first load being for receiving a second current; and the first and second currents being substantially equal.

* * * * *